United States Patent
Niu et al.

(10) Patent No.: US 12,130,982 B2
(45) Date of Patent: *Oct. 29, 2024

(54) DISPLAY DEVICE WITH FLEXIBLE PRINTED CIRCUIT CONNECTED TO FORCE SENSING STRUCTURE

(71) Applicants: Chengdu BOE Optoelectronics Technology Co., Ltd., Sichuan (CN); BOE Technology Group Co., Ltd., Beijing (CN)

(72) Inventors: Wenxiao Niu, Beijing (CN); Lianbin Liu, Beijing (CN); Xu Lu, Beijing (CN); Hengzhen Liang, Beijing (CN); Qing Gong, Beijing (CN); Fan Li, Beijing (CN); Hui Wen, Beijing (CN); Wen Xu, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

This patent is subject to a terminal disclaimer.

(21) Appl. No.: 18/301,611

(22) Filed: Apr. 17, 2023

(65) Prior Publication Data
US 2023/0251736 A1  Aug. 10, 2023

Related U.S. Application Data

(63) Continuation of application No. 16/959,018, filed as application No. PCT/CN2019/100274 on Aug. 12, 2019, now Pat. No. 11,662,853.

(51) Int. Cl.
G06F 3/041 (2006.01)
G02F 1/1333 (2006.01)
(Continued)

(52) U.S. Cl.
CPC .... *G06F 3/04164* (2019.05); *G02F 1/133308* (2013.01); *G02F 1/13338* (2013.01);
(Continued)

(58) Field of Classification Search
None
See application file for complete search history.

(56) References Cited

U.S. PATENT DOCUMENTS

2014/0145167 A1   5/2014  Son
2017/0344149 A1  11/2017  Ramakrishnan et al.
(Continued)

FOREIGN PATENT DOCUMENTS

CN   205353980 U   6/2016
CN   105827229 A   8/2016
(Continued)

OTHER PUBLICATIONS

International search report of PCT application No. PCT/CN2019/100274 issued on May 9, 2020.
(Continued)

*Primary Examiner* — Amare Mengistu
*Assistant Examiner* — Sarvesh J Nadkarni
(74) *Attorney, Agent, or Firm* — Lippes Mathias LLP

(57) ABSTRACT

A display device includes a controller, a frame, a display panel, an FPC and a force sensing structure; wherein the FPC is disposed on a back side of the display panel and electrically connected to the display panel, and the back side of the display panel is a side opposite to a light-emitting surface of the display panel; the force sensing structure is disposed on the FPC and electrically connected to the controller by the FPC; and the frame is disposed on a side, distal from the display panel, of the FPC, and a specified distance exists between the frame and the force sensing structure.

20 Claims, 4 Drawing Sheets

(51) Int. Cl.
    *G02F 1/1335*     (2006.01)
    *G02F 1/1345*     (2006.01)
    *H10K 50/84*     (2023.01)
    *H10K 59/40*     (2023.01)

(52) U.S. Cl.
    CPC .... *G02F 1/133528* (2013.01); *G02F 1/13452* (2013.01); *G06F 2203/04105* (2013.01); *H10K 50/841* (2023.02); *H10K 59/40* (2023.02)

(56) References Cited

U.S. PATENT DOCUMENTS

| | | |
|---|---|---|
| 2017/0351357 A1 | 12/2017 | Jo et al. |
| 2018/0160545 A1 | 6/2018 | Kim et al. |
| 2018/0203539 A1 | 7/2018 | Huang et al. |
| 2019/0187767 A1 | 6/2019 | Li et al. |
| 2020/0201484 A1* | 6/2020 | Lee .................. G06F 3/04144 |

FOREIGN PATENT DOCUMENTS

| | | |
|---|---|---|
| CN | 205608691 U | 9/2016 |
| CN | 206532274 U | 9/2017 |
| CN | 107390780 A | 11/2017 |
| KR | 20170034364 A | 3/2017 |

OTHER PUBLICATIONS

Extended European search report of counterpart European application No. 19933244.6 issued on Jul. 29, 2022.
Non-final office Action of U.S. Appl. No. 16/959,018 issued on Dec. 9, 2021.
Final office Action of U.S. Appl. No. 16/959,018 issued on Aug. 22, 2022.
Notice of allowance of U.S. Appl. No. 16/959,018 issued on Jan. 24, 2023.

* cited by examiner

DISPLAY DEVICE WITH FLEXIBLE PRINTED CIRCUIT CONNECTED TO FORCE SENSING STRUCTURE

CROSS-REFERENCE TO RELATED APPLICATION

This present disclosure is a continuation of U.S. patent application Ser. No. 16/959,018, filed on Jun. 29, 2020, which is a 371 of PCT Application No. PCT/CN2019/100274, filed on Aug. 12, 2019, the content of which is incorporated herein by reference.

TECHNICAL FIELD

The present disclosure relates to the field of display technologies, and in particular, relates to a display device and a terminal.

BACKGROUND

With the development of technology, a force sensing function may be provided in a current display device to detect a pressing operation performed by a user on a display panel of the display device. The pressing operation is detected by a force sensor in the display device.

In the display device of the related art, the force sensor includes a carrier substrate, a flexible printed circuit (FPC), a force sensing structure, etc. that are stacked from bottom to top. The force sensor is disposed between a display panel and a frame of the display device and senses a force value by utilizing changes of a gap between the force sensing structure of the force sensor and the frame.

SUMMARY

Embodiments of the present disclosure provide a display device and a terminal. The technical solutions are as follows:

In a first aspect, a display device is provided. The display device includes a controller, a frame, a display panel, a flexible printed circuit (FPC), and a force sensing structure, wherein
  the FPC is disposed on a back side of the display panel and electrically connected to the display panel, the controller is connected to the FPC, and the back side of the display panel is a side opposite to a light-emitting surface of the display panel;
  the force sensing structure is disposed on the FPC and electrically connected to the controller by the FPC; and the frame is disposed on a side, distal from the display panel, of the FPC, and a specified distance exists between the frame and the force sensing structure.

Optionally, the force sensing structure is disposed on a side, proximal to the frame, of the FPC.

Optionally, the display device further includes a display controller electrically connected to the FPC.

Optionally, the display panel further includes a touch layer; the display device includes a touch controller; and the touch controller is electrically connected to the FPC and electrically connected to the touch layer by the FPC.

Optionally, the display panel further includes a touch layer, and the controller is a touch controller;
  the display device further includes a display controller electrically connected to the FPC; and
  the touch controller is disposed on the FPC and electrically connected to the touch layer by the FPC, and the force sensing structure is electrically connected to the touch controller by the FPC.

Optionally, the force sensing structure includes at least one sensing substructure.

Optionally, the at least one sensing substructure includes at least two sensing substructures, and orthographic projections of the at least two sensing substructures on the back side of the display panel are uniformly distributed on the back side of the display panel.

Optionally, the force sensing structure is welded to the FPC.

Optionally, the force sensing structure is bonded to the FPC.

Optionally, the force sensing structure is bonded to the FPC by a mesh double-faced tape.

Optionally, a binding area is provided on the FPC, and the FPC is electrically connected to the display panel by the binding area; the force sensing structure is disposed at a target position on the FPC, and the target position is disposed on a side, distal from the side where the binding area is disposed, of the FPC; and
  the force sensing structure includes at least one sensing substructure arranged in a direction distal from the binding area.

Optionally, the display panel is an organic light-emitting diode (OLED) display panel, and a buffer layer is provided between the OLED display panel and the force sensing structure;
  the display device further includes a polarizer, a cover plate and a touch sensor;
  the touch sensor is disposed on a side, distal from the frame, of the display panel;
  the polarizer is disposed on a side, distal from the frame, of the touch sensor; and
  the cover plate is disposed on a side, distal from the frame, of the polarizer.

Optionally, the display panel is a liquid crystal display panel, and a backlight module is provided between the liquid crystal display panel and the force sensing structure;
  the display device further includes a polarizer, a cover plate and a touch sensor;
  the touch sensor is disposed on a side, distal from the frame, of the display panel;
  the polarizer is disposed on a side, distal from the frame, of the touch sensor; and
  the cover plate is disposed on a side, distal from the frame, of the polarizer.

Optionally, the display device further includes a display controller, wherein the force sensing structure is disposed on a side, proximal to the frame, of the FPC;
  the FPC is electrically connected to the display controller;
  the display panel further includes a touch layer, the controller is a touch controller, the touch controller is disposed on the FPC and electrically connected to the touch layer by the FPC, and the force sensing structure is electrically connected to the touch controller by the FPC; and
  the force sensing structure includes at least two sensing substructures, and orthographic projections of the at least two sensing substructures on the back side of the display panel are uniformly distributed on the back of the display panel.

In a second aspect, a terminal is provided. The terminal includes the display device as described in the first aspect.

The technical solutions provided by the embodiments of the present disclosure have at least the following beneficial effects.

Since a force sensing structure is connected to a controller by an FPC, and the FPC connected to the controller is an inherent FPC in the display device, there is no need to provide the force sensing structure with a carrier substrate, an FPC, etc. Therefore, the structure of the display device is simplified, and the manufacturing cost of the display device having the force sensing function is reduced to some extent.

BRIEF DESCRIPTION OF THE DRAWINGS

In order to describe the technical solutions in the embodiments of the present disclosure more clearly, the following briefly introduces the accompanying drawings required for describing the embodiments. Apparently, the accompanying drawings in the following description show merely some embodiments of the present disclosure, and a person of ordinary skill in the art may also derive other drawings from these accompanying drawings without creative efforts.

DETAILED DESCRIPTION

For clearer descriptions of the objectives, technical solutions and advantages of the present disclosure, the present disclosure is described in detail below in combination with the accompanying drawings.

With the development of technology, more and more functions can be realized by a terminal, and one of the commonly used functions is a force sensing function. Taking a mobile terminal as an example, the force sensing function integrated in a display module of the mobile terminal may be used for realizing such functions as under-screen fingerprint, under-screen camera and under-screen force sensing.

Under-screen fingerprint is an emerging function, which is increasingly used in the display industry. If the under-screen fingerprint is used in conjunction with the under-screen force sensing, the user experience may be better improved.

The under-screen force sensing is realized by a force sensor, which may be a capacitive sensor or a resistive sensor. The embodiments of the present disclosure take the capacitive sensor as an example for explanation.

Currently, in an implementation, the capacitive sensor can realize the under-screen force sensing function by attaching force sensors on the whole back surface of the display panel. However, in this solution, it is necessary to manufacture the force sensors first and then attach them to the back surface of the display panel. The completed force sensor includes a carrier substrate, an FPC, a force sensing structure, etc. that are disposed in a stacked mode. The FPC of the force sensor is electrically connected to an inherent FPC in the display device by an external lead. This arrangement not only causes the manufacturing process and structure of the force sensor to be more complicated, but also leads to higher manufacturing cost. In addition, as the lead is usually fragile and prone to breakage, the stability of the force sensor is poor. Correspondingly, the display device with such a force sensor may be complicated in manufacturing process and structure, high in manufacturing cost and poor in stability. Moreover, this solution will also lead to an increase in the thickness of the display device.

Figure 1:
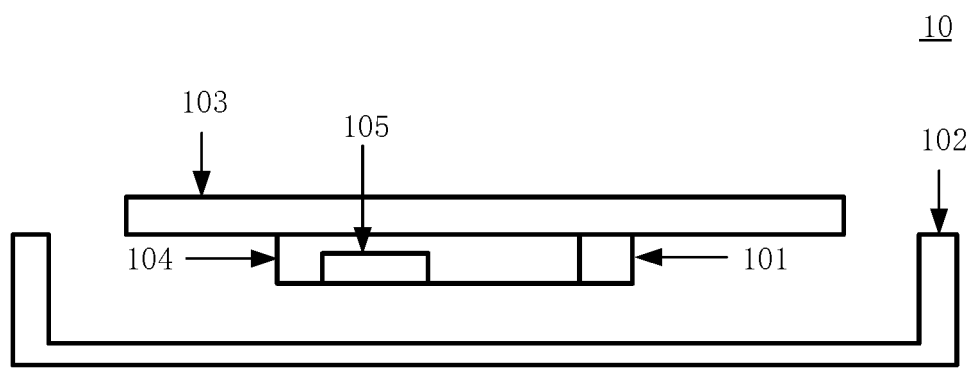
FIG. 1 is a schematic structural diagram of a display device according to an embodiment of the present disclosure.

An embodiment of the present disclosure provides a display device, which can solve the technical problems in the related art. As shown in FIG. 1, the display device 10 includes a controller 101, a frame 102, a display panel 103, an FPC 104 and a force sensing structure 105.

The FPC 104 is disposed on a back side of the display panel 103 and electrically connected to the display panel 103. The back side of the display panel 103 is a side, opposite to a light-emitting surface, of the display panel 103.

The force sensing structure 105 is disposed on the FPC 104 and electrically connected to the controller 101 by the FPC 104. The frame 102 is disposed on a side, distal from the display panel 103, of the FPC 104, and a specified distance exists between the frame and the force sensing structure 105.

In the embodiment of the present disclosure, the force sensing function is realized by the display device sensing changes of capacitance through changes of the distance between the frame 102 and the force sensing structure 105. The specified distance refers to a maximum distance at which a change of the capacitance can be sensed. If the distance between the frame 102 and the force sensing structure 105 exceeds the maximum distance, it is difficult to sense the changes of the capacitance through the changes of the distance between the frame 102 and the force sensing structure 105 even if the distance is changed by pressing, which thereof will not realize the force sensing function. Optionally, the frame 102 is a frame structure for bearing the display panel 103. For example, the frame 102 is a middle frame.

In summary, according to the display device provided by the embodiment of the present disclosure, since the force sensing structure is connected to the controller by the FPC, and the FPC connected to the controller is an inherent FPC in the display device, there is no need to provide the force sensing structure with a carrier substrate, an FPC, etc. Therefore, the structure of the display device is simplified, and the manufacturing cost of the display device with the force sensing function is reduced to some extent.

Besides, compared with the related art that force sensors have to be attached onto the whole back side of the display panel, the thickness of the laminated layer in the display device does not need to be increased since there is no need to attach the force sensors onto the whole back side of the display panel in the embodiment of the present disclosure, which is beneficial to realizing the lightness and thinness of the display device. Further, the FPC of the force sensor does not need to be plugged into the inherent FPC of the display device by a lead since the force sensing structure is disposed on the FPC in the embodiment of the present disclosure. Therefore, compared with the related art, the display device provided by the embodiment of the present disclosure can improve the reliability and the stability of the force sensing function.

Figure 2:
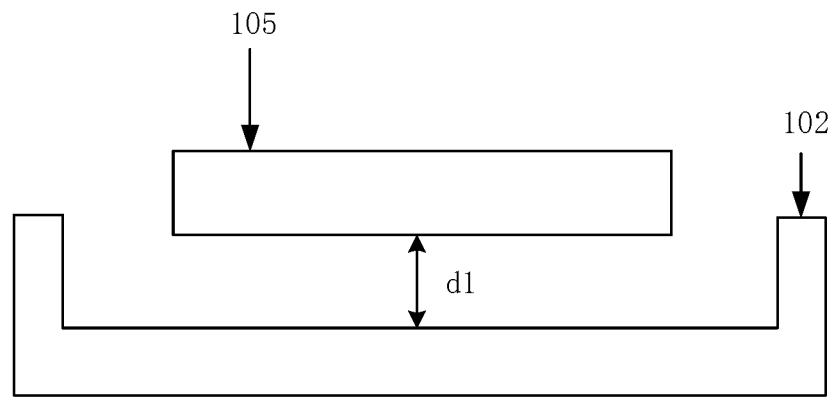
FIG. 2 is a schematic diagram of a force sensing structure and a frame in a state where a finger does not exert a force onto a display panel according to an embodiment of the present disclosure.
Figure 3:
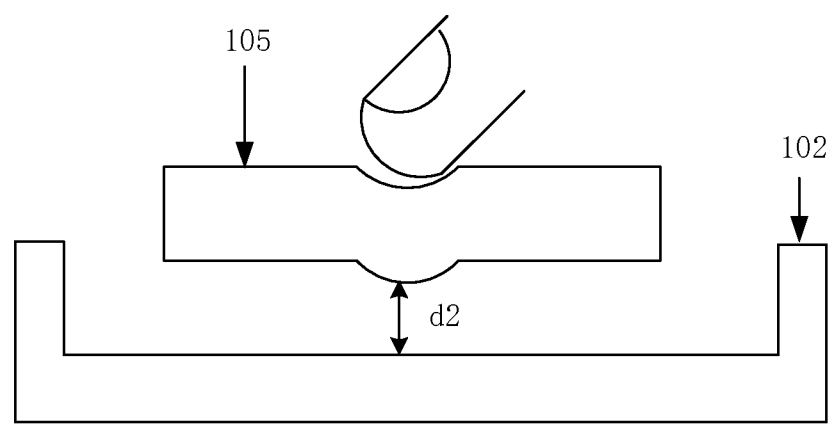
FIG. 3 is a schematic diagram of a force sensing structure and a frame in a state where a finger exerts a force onto a display panel according to an embodiment of the present disclosure.

FIGS. 2 and 3 illustrate the working principle of a force sensing structure according to an embodiment of the present disclosure. The force sensing structure in the display device described in the embodiment of the present disclosure is based on the working principle of a capacitive sensor. FIG. 2 is a schematic diagram of a force sensing structure 105 and a frame 102 in a state where a finger does not exert a force onto a display panel (now shown in FIG. 2), and FIG. 3 is a schematic diagram of a force sensing structure 105 and a frame 102 in a state where a finger exerts a force onto a display panel (now shown in FIG. 2).

As can be seen from FIG. 2, in the state where the finger does not exert a force onto the display panel, a fixed distance d1 is provided between the force sensing structure 105 and the frame 102 and corresponds to capacitance C1 between the force sensing structure 105 and the frame 102. As can be seen from FIG. 3, in the state where the finger exerts a force onto the display panel, the force sensing structure 105 will deform to some extent with a pressing force exerted by the finger, and the shortest distance between the force sensing structure 105 and the frame 102, namely, a distance between the force sensing structure 105 and the frame 102 corresponding to the position where the finger presses, will become a distance d2 according to the deformation. The capacitance between the force sensing structure 105 and the frame 102 corresponding to the distance d2 is C2. The controller of the force sensing structure 105 may sense the corresponding capacitance according to the distance, calculate variation of the capacitance, and feedback a corresponding sensing signal. The sensing signal corresponds to the force exerted onto the display panel.

Figure 4:
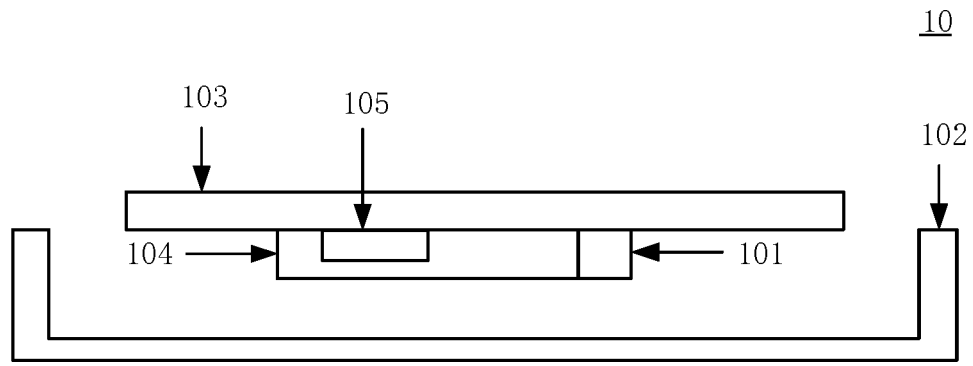
FIG. 4 is a schematic structural diagram of another display device according to an embodiment of the present disclosure.

Optionally, the force sensing structure 105 may be disposed on the side, proximal to the frame 102, of the FPC 104. As shown in FIG. 1, there is no FPC 104 for blocking between the force sensing structure 105 and the frame 102, in this way, the sensitivity of the force sensing structure can be improved to a certain extent, which makes it easier for the controller of the force sensing structure to accurately sense different capacitance corresponding to different distances. In other optional embodiments, as shown in FIG. 4, the force sensing structure 105 may be disposed on the side, distal from the frame 102, of the FPC 104. Certainly, the force sensing structure 105 may also be disposed in other positions on the FPC 104 as long as the controller that controls the force sensing structure can sense the capacitance between the force sensing structure 105 and the frame 102.

Usually, the display device having a capacitive force sensor is provided with foam inside, and the capacitive force sensor is attached onto the back side of the display panel by the foam. When a pressing operation is performed on the display panel, the distance between the force sensing structure in the force sensor and the frame changes to generate a sensing signal. During the pressing operation, the foam will deform accordingly, and as the frequency of the pressing operations increases, the foam will deform irreversibly. This irreversible deformation will reduce the sensitivity of the force sensor and even cause the failure in force sensing, which as a result adversely affects the force sensing function of the display device. In the force sensing structure according to the embodiments of the present disclosure, the deformation of the force sensing structure has nothing to do with the foam, and thus the failure in force sensing will not occur. Therefore, the stability of the force sensing function of the display device is improved.

In the embodiment of the present disclosure, the display device may be provided with one or more FPCs, and the force sensing structure may be disposed on any one of these FPCs.

Figure 5:
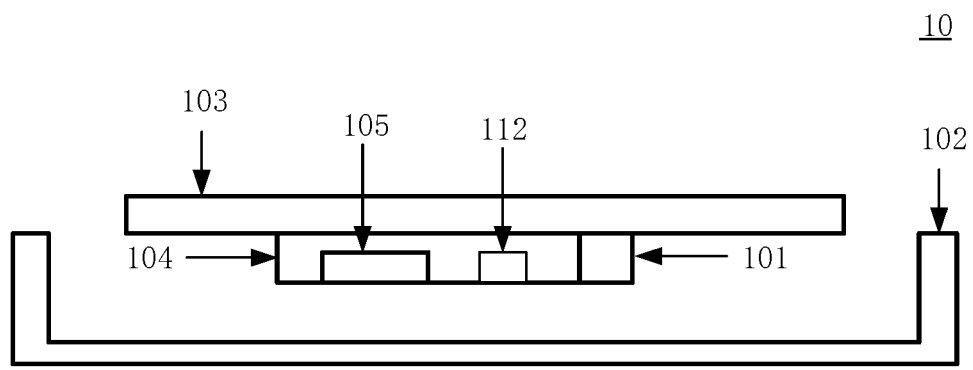
FIG. 5 is a schematic structural diagram of yet another display device according to an embodiment of the present disclosure.

In an implementation, referring to FIG. 5, the display device 10 further includes a display controller 112. Optionally, the display controller 112 may be a display driver chip. The FPC 104 is electrically connected to the display controller 112, and the FPC 104 electrically connected to the display controller 112 may also be called a Main FPC (MFPC). The force sensing structure 105 is disposed on the MFPC. The MFPC, an inherent structure in the display device, is used for connecting the display controller 112 with the display panel 103 and may be configured to transmit a signal sent by the display controller 112 to the display panel 103, such that the display panel 103 performs display according to the signal. In other optional implementations, the controller 101 for controlling the force sensing structure 105 may also be multiplexed as the display controller 112. That is, the controller 101 and the display controller 112 are the same controller. It is more conducive to realizing the miniaturized design of the display device when the controller 101 and the display controller 112 are the same controller. Certainly. FIG. 5 shows the case that two controllers are provided.

The display controller and the MFPC may be electrically connected in the following two ways: first, the display controller is disposed on the MFPC; and second, the display controller is disposed on a flexible substrate that is electrically connected to the MFPC by a circuit structure on the flexible substrate, and for example, the display controller is secured to the flexible substrate by the chip on film (COF) technology.

Due to the complicated circuit structure on the MFPC in the display device, the MFPC is usually large in size. Therefore, if the force sensing structure 105 is disposed on the MFPC, there is no need to increase the size of the MFPC, which is conducive to realizing the miniaturized design of the display device and effectively reducing the manufacturing cost of the display device having the force sensing function.

Optionally, the display panel in the display device may further include a touch layer. That is, the display panel may be a touch display panel. Correspondingly, the display device is a touch display device. In addition to the display controller, the touch display device is further provided with a touch controller. Optionally, the touch controller may be a touch IC.

The touch controller may realize a touch function in the following two ways: first, the touch controller is electrically connected to a touch circuit board, for example, the touch controller may be disposed on the touch circuit board to be electrically connected to the touch circuit board, and the touch controller is electrically connected to the MFPC by the touch circuit board and electrically connected to the touch layer by the MFPC; and second, the touch controller is electrically connected to the MFPC, for example, the touch controller may be disposed on the MFPC to be electrically connected to the touch circuit board, and the touch controller is electrically connected to the touch layer by the MFPC.

In the above-mentioned second implementation, since there is no need to additionally provide the touch controller with an FPC, that is, there is no need to provide the display device with a touch circuit board for connecting the touch controller. Therefore, the manufacturing cost of the display device is not only reduced, but also realized the integration of the touch function and a display function, which contributes to the miniaturization of the display device.

Certainly, the touch display device further includes a touch sensor. The touch sensor may be disposed on a light-emitting surface of the touch display panel (by the on-cell technology), or may be embedded into the touch display panel by an embedded technology (i.e., the in-cell technology). The touch controller controls the touch sensor to realize the touch function.

In another optional implementation of the embodiment of the present disclosure, no matter whether it is disposed on the MFPC or on the touch circuit board, the touch controller may be connected to the force sensing structure so as to control the force sensing structure to play a force sensing role. When the touch controller is disposed on the MFPC, wiring for connecting the force sensing structure with the touch controller may be provided on the MFPC, such that the force sensing structure may share the same touch controller with the touch sensor without additionally providing the force sensing structure with a controller. Therefore, miniaturization of the display device is realized while the manufacturing cost of the display device is reduced.

Optionally, the display panel may further include a touch layer, and correspondingly, the display device is a touch display device. In FIG. 5, the controller 101 connected to the force sensing structure 105 may be a touch controller. In addition, the display device 10 further includes a display controller 112 electrically connected to the FPC 104. The touch controller is disposed on the FPC (namely, the MFPC) 104 and electrically connected to the touch layer by the FPC. The force sensing structure 105 is electrically connected to the touch controller by the FPC 104.

In this implementation, since there is no need to provide the force sensing structure with an additional controller or to provide the touch controller with an additional touch FPC, the structure of the display device is simplified, which reduces the manufacturing cost of the display device having the force sensing function to some extent.

Figure 6:
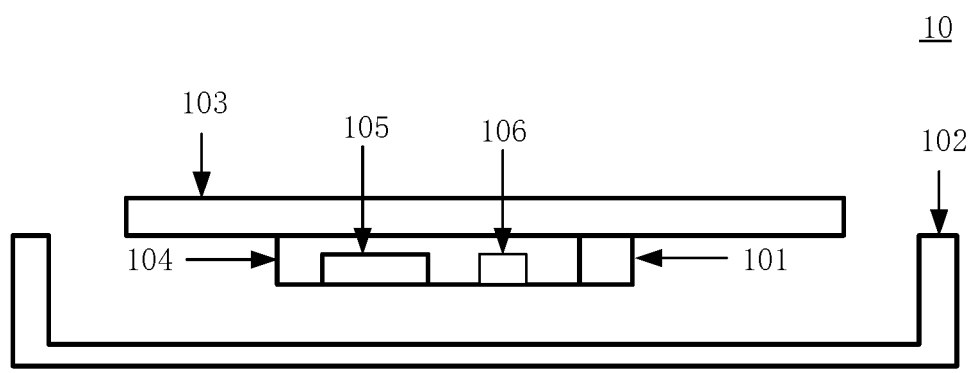
FIG. 6 is a schematic structural diagram of yet another display device according to an embodiment of the present disclosure.

In another implementation, referring to FIG. 6, the display device 10 is a touch display device, the display panel 103 includes a touch layer, and the display panel 103 is a touch display panel, the display device 10 further includes a touch controller 113, and the FPC 104 is a touch FPC. That is, the force sensing structure 105 is disposed on the touch FPC. The touch FPC, an inherent structure in the display device, is used for connecting the touch controller with the display panel. In other optional implementations, the controller 101 for controlling the force sensing structure 105 may also be multiplexed as a touch controller 106. That is, the controller 101 and the touch controller 106 are the same controller. It is more conducive to realizing the miniaturized design of the display device when the controller 101 and the touch controller 106 are the same controller. Certainly, FIG. 6 shows the case that two controllers are provided.

In this implementation, since the force sensing structure 105 is directly disposed on the inherent touch FPC in the touch display device without separately providing the force sensing structure with a carrier substrate, an FPC or the like, the structure of the display device is simplified, and the manufacturing cost of the display device having the force sensing function is reduced to some extent.

Optionally, the force sensing structure may include at least one sensing substructure. Exemplarily, the force sensing structure may include at least two sensing substructures. The at least one sensing substructure may be distributed on the FPC in various forms, and the embodiment in the present disclosure takes the following two distribution modes as examples for explanation. Both of following two distribution modes take that the force sensing structure includes at least two sensing substructures as an example for the explanation.

In the first distribution mode, orthographic projections, on the back side of the display panel, of the at least two sensing substructures on the FPC are uniformly distributed on the back side of the display panel. In this way, each of the sensing substructures may be configured to respectively sense a force that acts on an area corresponding to the sensing substructure, so as to realize full-screen sensing.

In the second distribution mode, the orthographic projection of the force sensing structure 105 on the back side of the display panel (not shown) may be disposed in the geometric center of the back side of the display panel.

Figure 7:
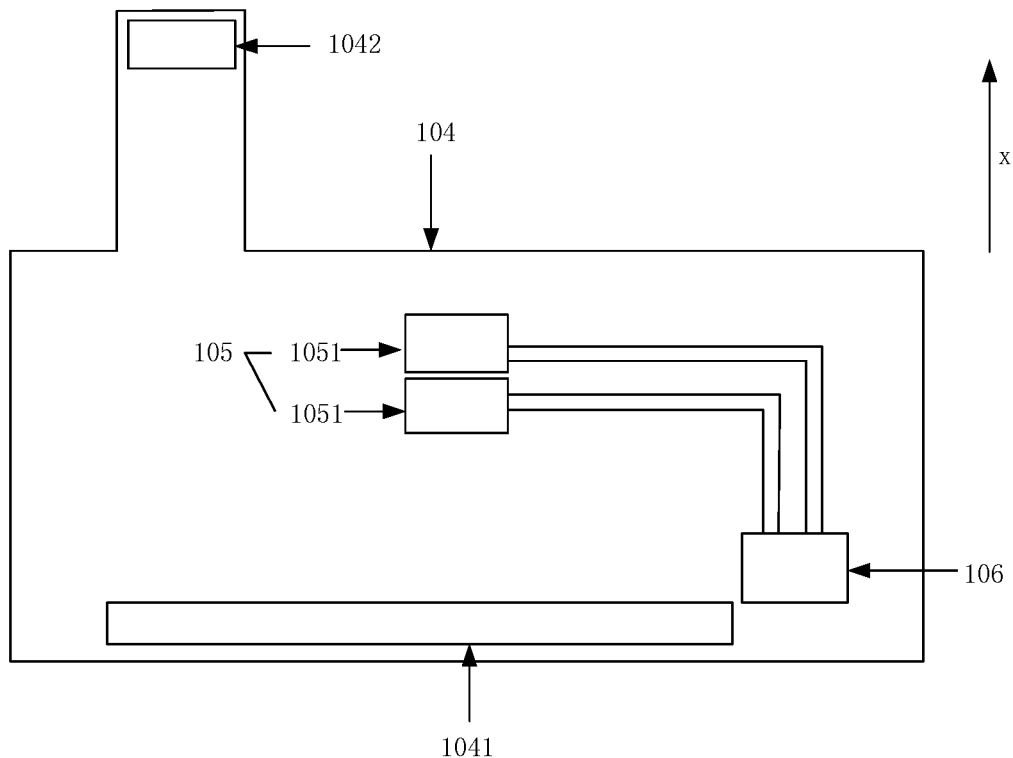
FIG. 7 is a structural top view of an MFPC according to an embodiment of the present disclosure.

FIG. 7 is a structural top view of an FPC 104 in the display device according to an embodiment of the present disclosure. The display device is a touch display device. The FPC 104 is an MFPC on which a touch controller 106 is provided. Wiring on the FPC connects two sensing substructures 1051 and the touch controller 106. That is, in the touch display device, the force sensing structure 105 and a touch sensor (not shown in FIG. 7) share the touch controller. In addition, a binding area 1041 is provided on the FPC 104 and configured to connect the FPC 104 with a display panel (not shown in FIG. 7). A connector 1042 is further provided on the FPC 104 and configured to connect the FPC 104 with a main board (not shown in FIG. 7) of the touch display device. FIG. 7 takes the fact that the force sensing structure includes two sensing substructures as an example for explanation, and FIG. 7 merely schematically shows the case that the two sensing substructures are disposed on the FPC 104.

Optionally, the force sensing structure 105 may be disposed at a target position on the FPC 104, and the target position is the side, distal from the side where the binding area 1041 is disposed, of the FPC 104. When the force sensing structure 105 includes at least one sensing substructure 1051, the at least one sensing substructure may be arranged in a direction distal from the binding area 1041. Schematically illustrating, the direction distal from the binding area 1041 is the direction x shown in FIG. 7. Since the binding area 1041 is usually disposed in an edge area of the FPC 104 or even in an edge area of the display panel, the force sensing structure 105 disposed on the side distal from the side where the binding area 1041 is disposed is more proximal to the center of the display panel, thereby improving the accuracy in force sensing.

In the above-mentioned second distribution mode, the full-screen sensing may be achieved by setting the size of each sensing substructure 1051. The size of each sensing substructure 1051 may be set according to the size of the display panel. When a user's finger exerts a force onto any position on the display panel, the distance between at least one sensing substructure 1051 and the frame may change, and the controller that controls the force sensing structure can effectively sense the change, calculate variation of capacitance and feedback a corresponding sensing signal.

Certainly, in other optional distribution modes, the at least two sensing substructures 1051 may be disposed in any position on the FPC 104.

Optionally, the force sensing structure may be disposed on the FPC in multiple ways. The present embodiment takes the following two setting modes as examples for explanation.

In the first setting mode, the force sensing structure is welded on the FPC. The display device may include a bonding pad that may be a carrier substrate for bearing the force sensing structure. The force sensing structure is disposed on the bonding pad and welded to the FPC by the bonding pad. Optionally, when the force sensing structure includes at least two sensing substructures, the display device may include at least two bonding pads, and the sensing substructures are respectively disposed on the corresponding bonding pads. Certainly, the sensing substructures and the bonding pads may be in one-to-one correspondence, or in many-to-one correspondence. That is, several sensing substructures may be disposed on one bonding pad, which is not limited in the embodiments of the present disclosure.

In the second setting mode, the force sensing structure is bonded to the FPC. The force sensing structure may be bonded to the FPC by a double-faced tape. Optionally, in order to prevent the force sensing function of the force sensing structure from being adversely affected by bubbles generated by the double-faced tape by which the force sensing structure and the FPC are bonded to each other, the double-faced tape may be a mesh double-faced tape.

Optionally, the force sensing structure is a conductive force sensing film that may be made of a metal material, for example, copper.

Figure 8:
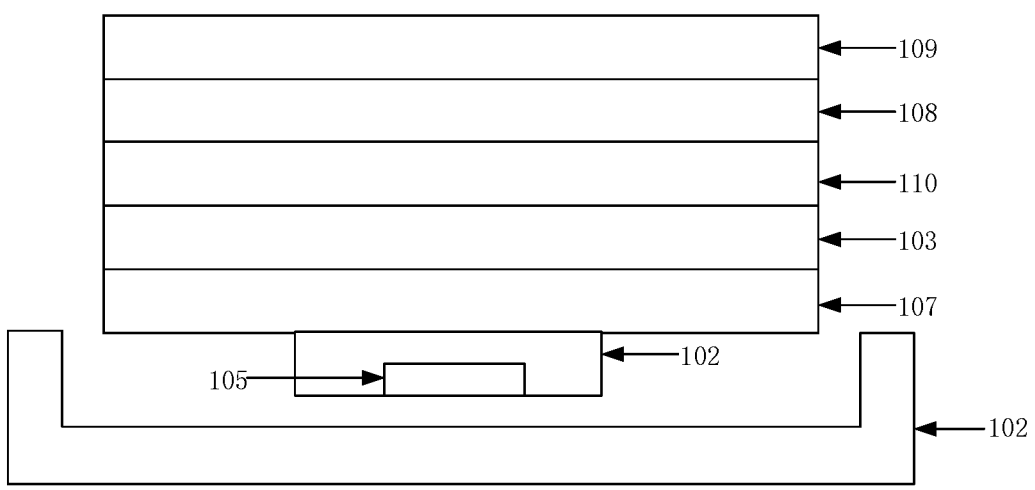
FIG. 8 is a schematic structural diagram of yet another display device according to an embodiment of the present disclosure.

Optionally, FIG. 8 is a schematic structural diagram of yet another display device 10 according to an embodiment of the present disclosure. The display device 10 is an OLED display device, and the display panel 103 is an OLED display panel. A buffer layer 107 is provided between the display panel 103 and the force sensing structure 105. Optionally, the buffer layer 107 may be foam. The display device 10 further includes a polarizer 108 disposed on the side, distal from the frame 102, of the display panel 103 and a cover plate 109 disposed on the side, distal from the display panel 103, of the polarizer 108. Optionally, the cover plate 109 may be a glass cover plate. Optionally, as shown in FIG. 8, the display device 10 may also be an OLED display device having a touch function. That is, the display panel 103 is an OLED display panel having the touch function. Then, the display device 10 further includes a touch sensor 110 disposed on a light-emitting surface of the display panel 103. The touch sensor may be realized by a touch layer.

Figure 9:
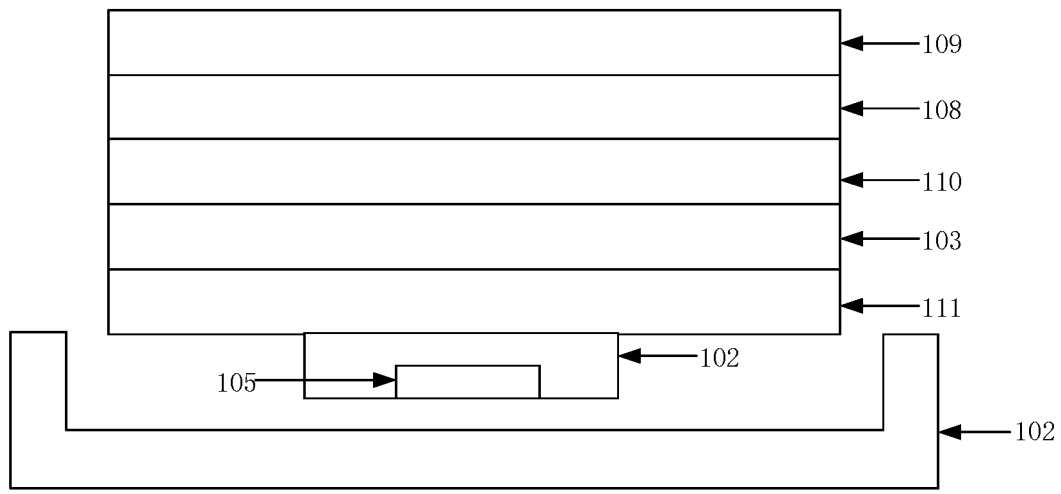
FIG. 9 is a schematic structural diagram of yet another display device according to an embodiment of the present disclosure.

Optionally, FIG. 9 is a schematic structural diagram of yet another display device 10 according to an embodiment of the present disclosure. The display device 10 is a liquid crystal display device. The display panel 103 is a liquid crystal display panel. A backlight module 111 is provided between the display panel 103 and the force sensing structure 105. A reference may be made to the relevant description of FIG. 8 for other structures shown in FIG. 9, which will not be repeated herein by the embodiments of the present disclosure.

In the above-mentioned OLED display device and liquid crystal display device, the cover plate 109 is configured to protect the display panel 103 from external abrasion and external impact. The buffer layer 107 and the backlight module 111 are configured to protect the display panel 103 from excessive contact with the frame 102 during the pressing operation. Certainly, the display device 10 may further include structures such as a touch controller, which are not shown one by one in FIG. 8 or 9.

In summary, in the display device according to the embodiments of the present disclosure, since the force sensing structure is connected to the controller by the FPC, and the FPC connected to the controller is an inherent FPC in the display device, there is no need to provide the force sensing structure with a carrier substrate, an FPC, etc. Therefore, the structure of the display device is simplified, and the manufacturing cost of the display device with the force sensing function is reduced to some extent.

An embodiment of the present disclosure provides a terminal. The terminal may include the display device described in the above embodiments, and may be any product having a display function, such as a mobile phone, a tablet computer, a television, a display, a notebook computer, a digital photo frame or a navigator.

The foregoing descriptions are merely optional embodiments of the present disclosure, and are not intended to limit the present disclosure. Within the spirit and principles of the disclosure, any modifications, equivalent substitutions, improvements, or the like are within the protection scope of the present disclosure.

What is claimed is:

1. A touch display device, comprising a touch controller, a touch display panel, a touch flexible printed circuit (FPC), and a force sensing structure; wherein
   the touch FPC is disposed on a back side of the touch display panel, the back side of the touch display panel being a side opposite to a light-emitting surface of the touch display panel, and the touch display panel comprises a touch layer;
   the touch controller is disposed on the touch FPC, and the touch controller is electrically connected to the touch layer by the touch FPC and configured to control the touch display panel to realize a touch function and a display function;
   the force sensing structure is disposed on the touch FPC, and the touch controller is electrically connected to the force sensing structure by the touch FPC and configured to control the force sensing structure to realize a force sensing function; and
   a connector is further provided on the touch FPC and configured to connect the touch FPC with the touch display panel.

2. The touch display device according to claim 1, further comprising a frame, wherein the frame is disposed on a side, distal from the touch display panel, of the touch FPC, and a specified distance exists between the frame and the force sensing structure.

3. The touch display device according to claim 1, wherein the force sensing structure is disposed on a side, proximal to the frame, of the touch FPC.

4. The touch display device according to claim 1, wherein the force sensing structure comprises at least one sensing substructure.

5. The touch display device according to claim 4, wherein the force sensing structure comprises at least two sensing substructures, orthographic projections of the at least two sensing substructures on the back side of the touch display panel being uniformly distributed on the back side of the touch display panel.

6. The touch display device according to claim 1, wherein the force sensing structure is a conductive force sensing film.

7. The touch display device according to claim 6, wherein the force sensing structure is made of metal material.

8. The touch display device according to claim 1, wherein the force sensing structure is welded to the touch FPC.

9. The touch display device according to claim 1, wherein the force sensing structure is bonded to the touch FPC.

10. The touch display device according to claim 9, wherein the force sensing structure is bonded to the touch FPC by a mesh-like double-faced tape.

11. The touch display device according to claim 1, wherein a binding area is provided on the touch FPC, and the touch FPC is electrically connected to the touch display panel by the binding area;
- the force sensing structure is disposed at a target position on the touch FPC, and the target position is disposed on a side, distal from the side where the binding area is disposed, of the touch FPC; and
- the force sensing structure comprises at least one sensing substructure arranged in a direction distal from the binding area.

12. The touch display device according to claim 1, wherein the touch display panel is an organic light-emitting diode (OLED) display panel, and a buffer layer is provided between the OLED display panel and the force sensing structure;
- the touch display device further comprises a polarizer, a cover plate and a touch sensor;
- the touch sensor is disposed on a side, distal from the frame, of the touch display panel;
- the polarizer is disposed on a side, distal from the frame, of the touch sensor; and
- the cover plate is disposed on a side, distal from the frame, of the polarizer.

13. The touch display device according to claim 1, wherein the touch display panel is a liquid crystal display panel, and a backlight module is provided between the liquid crystal display panel and the force sensing structure;
- the touch display device further comprises a polarizer, a cover plate and a touch sensor;
- the touch sensor is disposed on a side, distal from the frame, of the touch display panel;
- the polarizer is disposed on a side, distal from the frame, of the touch sensor; and
- the cover plate is disposed on a side, distal from the frame, of the polarizer.

14. The touch display device according to claim 1, wherein the force sensing structure is disposed on a side, proximal to the frame, of the touch FPC; and
- the force sensing structure comprises at least two sensing substructures, orthographic projections of the at least two sensing substructures on the back side of the touch display panel being uniformly distributed on the back of the touch display panel.

15. A terminal, comprising a touch display device, wherein the touch display device comprises a touch controller, a touch display panel, a touch flexible printed circuit (FPC), and a force sensing structure; wherein
- the touch FPC is disposed on a back side of the touch display panel, the back side of the touch display panel being a side opposite to a light-emitting surface of the touch display panel, and the touch display panel comprises a touch layer;
- the touch controller is disposed on the touch FPC, and the touch controller is electrically connected to the touch layer by the touch FPC and configured to control the touch display panel to realize a touch function and a display function;
- the force sensing structure is disposed on the touch FPC, and the touch controller is electrically connected to the force sensing structure by the touch FPC and configured to control the force sensing structure to realize a force sensing function; and
- a connector is further provided on the touch FPC and configured to connect the touch FPC with the touch display panel.

16. The terminal according to claim 15, wherein the touch display device further comprises a frame, and the frame is disposed on a side, distal from the touch display panel, of the touch FPC, and a specified distance exists between the frame and the force sensing structure.

17. The terminal according to claim 15, wherein the force sensing structure is disposed on a side, proximal to the frame, of the touch FPC.

18. The terminal according to claim 15, wherein the force sensing structure comprises at least one sensing substructure.

19. The terminal according to claim 15, wherein the touch display panel is an organic light-emitting diode (OLED) display panel, and a buffer layer is provided between the OLED display panel and the force sensing structure;
- the touch display device further comprises a polarizer, a cover plate and a touch sensor;
- the touch sensor is disposed on a side, distal from the frame, of the touch display panel;
- the polarizer is disposed on a side, distal from the frame, of the touch sensor; and
- the cover plate is disposed on a side, distal from the frame, of the polarizer.

20. The terminal according to claim 15, wherein the touch display panel is a liquid crystal display panel, and a backlight module is provided between the liquid crystal display panel and the force sensing structure:
- the touch display device further comprises a polarizer, a cover plate and a touch sensor;
- the touch sensor is disposed on a side, distal from the frame, of the touch display panel;
- the polarizer is disposed on a side, distal from the frame, of the touch sensor; and
- the cover plate is disposed on a side, distal from the frame, of the polarizer.

* * * * *